United States Patent
Kim et al.

(10) Patent No.: US 9,145,243 B2
(45) Date of Patent: Sep. 29, 2015

(54) CUP USING TRANSPARENT FLEXIBLE DISPLAY

(71) Applicants: Yoo-Ra Kim, Yongin (KR); Hyun-Gu Kang, Yongin (KR); Jae-Moon Kim, Yongin (KR); Su-Yeon Yun, Yongin (KR)

(72) Inventors: Yoo-Ra Kim, Yongin (KR); Hyun-Gu Kang, Yongin (KR); Jae-Moon Kim, Yongin (KR); Su-Yeon Yun, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 8 days.

(21) Appl. No.: 14/074,094

(22) Filed: Nov. 7, 2013

(65) Prior Publication Data

US 2014/0313176 A1    Oct. 23, 2014

(30) Foreign Application Priority Data

Apr. 18, 2013  (KR) .......................... 10-2013-0043028

(51) Int. Cl.
| | |
|---|---|
| *G06F 3/038* | (2013.01) |
| *B65D 51/24* | (2006.01) |
| *G09G 3/32* | (2006.01) |
| *A47G 19/22* | (2006.01) |

(52) U.S. Cl.
CPC .......... *B65D 51/245* (2013.01); *A47G 19/2227* (2013.01); *G09G 3/3225* (2013.01); *G09G 2300/0443* (2013.01); *G09G 2320/041* (2013.01); *G09G 2320/0626* (2013.01); *G09G 2340/14* (2013.01)

(58) Field of Classification Search
CPC ............................ B65D 51/245; G09G 3/3225
USPC ....................................................... 345/76–83
See application file for complete search history.

(56) References Cited

U.S. PATENT DOCUMENTS

| | | | | |
|---|---|---|---|---|
| 7,098,887 | B2* | 8/2006 | Rezania | 345/101 |
| 8,550,288 | B2* | 10/2013 | Briar et al. | 220/664 |
| 8,797,318 | B2* | 8/2014 | Yoo et al. | 345/419 |
| 2002/0097195 | A1 | 7/2002 | Frank | |
| 2005/0016381 | A1* | 1/2005 | Chan | 99/275 |
| 2008/0034627 | A1 | 2/2008 | Schnuckle | |
| 2010/0045705 | A1* | 2/2010 | Vertegaal et al. | 345/661 |
| 2012/0049215 | A1* | 3/2012 | Yoon et al. | 257/91 |
| 2012/0158173 | A1* | 6/2012 | Metropulos et al. | 700/236 |
| 2013/0084796 | A1* | 4/2013 | Kerr | 455/39 |
| 2014/0015772 | A1* | 1/2014 | Tung et al. | 345/173 |

FOREIGN PATENT DOCUMENTS

KR    10-2011-0019827 A    3/2011

OTHER PUBLICATIONS

Translation of Internet announcement made Nov. 19, 2012.
Internet announcement made Dec. 4, 2012.
Internet announcement made Dec. 7, 2012.

* cited by examiner

*Primary Examiner* — Michael Pervan
*Assistant Examiner* — Andrew Lee
(74) *Attorney, Agent, or Firm* — Lee & Morse, P.C.

(57) ABSTRACT

Provided is a cup to which a transparent display is applied, the cup including a body comprising a display unit capable of showing contents in the body or displaying content; and a support being attached to or detached from the body, generating a control signal so as to control the content displayed on the display unit, and transmitting the control signal to the body.

17 Claims, 6 Drawing Sheets

CUP USING TRANSPARENT FLEXIBLE DISPLAY

CROSS-REFERENCE TO RELATED APPLICATION

Korean Patent Application No. 10-2013-0043028 filed on Apr. 18, 2013, in the Korean Intellectual Property Office, and entitled: "CUP USING TRANSPARENT FLEXIBLE DISPLAY," is incorporated by reference herein in its entirety.

BACKGROUND

1. Field

Embodiments relate to a cup using a transparent flexible display.

2. Description of the Related Art

A display device indicates a device that displays an image signal. The display device includes devices such as televisions, computer monitors, personal digital assistants (PDAs), smart devices such as phones and tablets that are recently used with tremendous popularity, or the like that display an image signal from an external source.

SUMMARY

Embodiments are directed to a cup having a transparent display, the cup including a body, the body having a cavity and including a display unit, the display unit being configured to display an image, and being configured to transmit light so as to show contents contained in the cavity, and a support being attached to or detached from the body, generating a control signal so as to control the image displayed on the display unit, and transmitting the control signal to the body.

The body may include a bottom board that is electrically or physically connected with the support.

The bottom board may measure a temperature of the contents and then transmit a value of the temperature to the support.

The bottom board may adjust a temperature of the contents by transmitting heat from the support.

The display unit may be connected with the bottom board via lines, and the image may be controlled by the control signal that is transferred from the support to the bottom board.

The display unit may be formed at an outer wall of the body.

The support may receive data about an image to be displayed on the display unit, by communicating with an external device, and generate the control signal based on the image.

The support may supply a charge power to the display unit of the body.

The image may correspond to a temperature of the contents.

The image may correspond to a method of making the contents.

The display unit may include a plurality of transparent organic light emitting diodes (OLEDs), each having a hole injection electrode, an emission layer, and an electron injection electrode.

The display unit may include a transparent electrode and a transparent substrate.

The display unit may function as lighting, and the support may generate a control signal so as to control brightness of the display unit.

Embodiments are also directed to a display device formed at an outer wall of a cup, the display device including a flexible substrate that is bent due to an external force, a plurality of pixels that are formed on the flexible substrate and that have a first region for emission and a second region for transmission of external light, wherein contents in the cup may be shown via the second region, and lines that receive an electric power from a support of the cup.

The display device may further include a plurality of thin film transistors (TFTs) that are disposed at the first region of each of the plurality of pixels, a plurality of first electrodes that are disposed at the first region of each of the plurality of pixels and that are electrically connected with the plurality of TFTs, respectively, a second electrode that faces the plurality of first electrodes and that has a plurality of island-form transmission windows corresponding to the second region, and an organic layer that is interposed between the first electrode and the second electrode.

Embodiments are also directed to a method of controlling a cup having a transparent display, the method including generating, by a support of the cup, a control signal so as to control an image that is displayed on a display unit of a body, providing, by the support, an electric power to the display unit of the body, and displaying the image according to the control signal, by the display unit of the body which receives the electric power. When the display unit does not receive the electric power, the display unit may show contents in the body.

The support may receive data about an image to be displayed on the display unit, by communicating with an external device, and generate the control signal based on the image.

The image may correspond to a temperature of the contents in the body or correspond to a method of making the contents.

Embodiments are also directed to a cup having a transparent display, the cup including a body, the body having a cavity and including a display unit at a wall of the cavity. The display unit may be configured to display an image, and may be configured to transmit light so as to show contents contained in the cavity, and the body may be configured to attach to and detach from a support, and may be configured to receive a control signal generated by the support, the control signal controlling the image displayed on the display unit.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
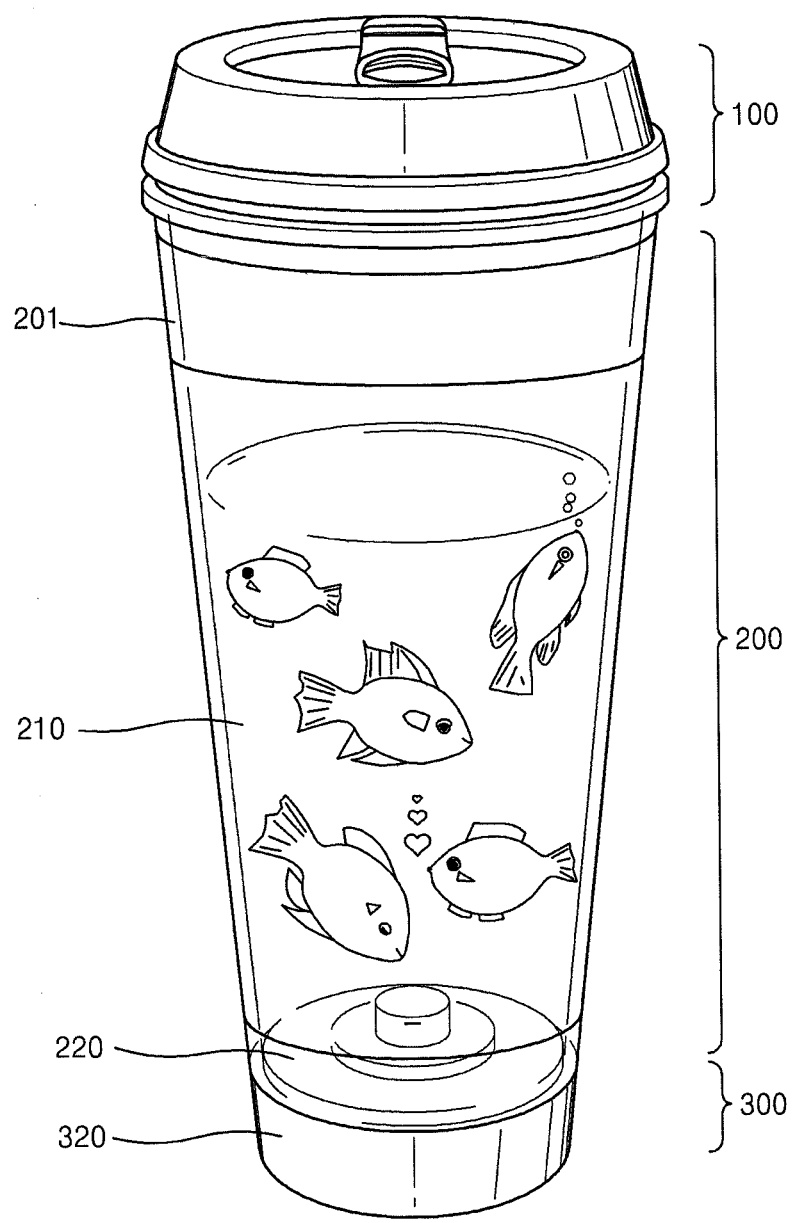
FIG. 1 is a diagram illustrating a cup using a transparent display according to an example embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

As used herein, the term "and/or" includes any and all combinations of one or more of the associated listed items.

FIG. 1 is a diagram illustrating a cup using a transparent display according to an example embodiment.

According to the present example embodiment, referring to FIG. 1, the cup includes a body 200 including a transparent display, and may be provided with a cover 100 and a support 300. In the present example embodiment of FIG. 1, the cup has a tumbler shape, but a shape of the cup may be any suitable shape of a general cup capable of containing contents, e.g., liquid contents.

The cover 100 may function to externally block a top portion of the body 200, e.g., so as to prevent foreign substances from entering into the body 200, and may include a hole or the like that is opened or closed by a user to drink liquid contents. In the present example embodiment, the cover 100 may correspond to a cover of a general cup. Also, a shape of a part of the cover 100 which is coupled with the body 200 may vary according to a shape of the body 200.

The body 200 may function to contain the contents of the cup, and may include a display unit 210 and a bottom board 220. In the example embodiment shown in FIG. 1, the body 200 has a cylindrical shape, but the body 200 may have various shapes.

In addition, the body may have an empty space or cavity inside so as to contain the contents, and may include an outer wall 201 that surrounds the cavity. The outer wall 201 may be formed of a transparent material so as to allow the contents in the cavity to be visible at the outside of the body 200. For example, the outer wall 201 of the body 200 may be formed of transparent plastic.

As illustrated in FIG. 1, the outer wall 201 may have a one-layer structure, and the display unit 210 may be arranged at an outer side surface of the outer wall 201. In another implementation, the outer wall 201 may have a two-layer structure, and the display unit 210 may be formed in a space between two layers of the outer wall 201.

The bottom board 220 may be formed at a lower portion of the body 200. The bottom board 220 at the lower portion may be electrically or physically connected with the display unit 210 to transfer a display signal or supply an electric power to the display unit 210.

Hereinafter, a structure of the display unit 210 of the body 200 and a method of driving the display unit 210 that has received a control signal and the electric power from the bottom board 220 will be described in detail.

The display unit 210 may be one of a cathode ray tube (CRT), an electro luminescence (EL) display, a vacuum fluorescent display), a plasma display panel, a liquid crystal display (LCD), a thin-film transistor (TFT) LCD, an organic light-emitting display device, and an electrophoretic display.

According to an example embodiment, the display unit 210 is a transparent flexible display that may allow the contents in the body 200 to be visible at the outside of the body 200 and that may display a user-desired content or image. The image may refer to static or changing information such as an image (or photo) or text (e.g., relating to temperature, a recipe, etc.).

As illustrated in FIG. 1, the display unit 210 may be arranged at a side surface of the outer wall 201 of the body 200.

According to the present example embodiment, the display unit 210 has transparency. A display having the transparency may be formed as a transparent display device at which a user may view an object or an image at an opposite side via the display unit 210. For example, in a case where the display unit 210 is a transparent organic light-emitting display device, the display unit 210 may be formed so that, when the display unit 210 is turned off, the contents in the body 200 may be visible through the display unit 210, and when the display unit 210 is turned on, an image that is emitted in the display unit 210 may be visible through the display unit 210. In another implementation, while the display unit 210 is turned on, the contents may be visible through a space between patterns such as a TFT and various lines, other than an emission region. As illustrated in FIG. 1, the display unit 210 may display, e.g., fish images, according to user setting or a pre-input value.

Also, the display unit 210 may have flexibility. Here, the flexibility means excellent flexibility and may indicate a flexible characteristic that may be bent due to an external force. In the present example embodiment, since the cup has the flexibility, the display unit 210 may be attached to the cup or may be inserted into the outer wall 201 thereof.

In the present example embodiment, the body 200 of the cup may include the bottom board 220 to control the display unit 210. The bottom board 220 may be positioned at a bottom surface of the body 200 and may include lines that are connected with the display unit 210. The bottom board 220 may receive a control signal and an electric power from the support 300 (described below), and may drive the display unit 210.

In an implementation, the bottom board 220 may have a thermometer function. The bottom board 220 may measure a temperature of the contents in the body 200 and then may convert a value of the temperature into a digital value to be output as an image via the display unit 210, e.g., a temperature display. The bottom board 220 may receive heat from the support 300 and then may transfer the heat to an inner portion of the body 200, so that the support 300 may adjust a temperature of the contents in the body 200.

In the present example embodiment, the support 300 is detachable, and may be attached to or detached from the bottom board 220 of the cup, and may generate and transmit the control signal so as to control an image that is displayed by the display unit 210 according to a user-set value or a pre-set value. The support 300 transfers the control signal to the display unit 210 via the bottom board 220. The support 300 may include a processor (not shown) for generating control signal according to an image to be displayed by the display unit 210. The processor may generate the image by using pre-stored data or data that is transferred from an external device 500, may generate a control signal of the display unit 210 based on the image, and may transfer the control signal to the body 200 via a coupling unit 310 (refer to FIGS. 2 and 3).

In addition, the support 300 may receive an electric power from an external source and then may transfer the electric power to the bottom board 220 so as to charge the display unit 210. The support 300 may be attached to or detached from the bottom board 220. Thus, a user may use only the cup without the support 300 in a mobile environment.

Figure 2:
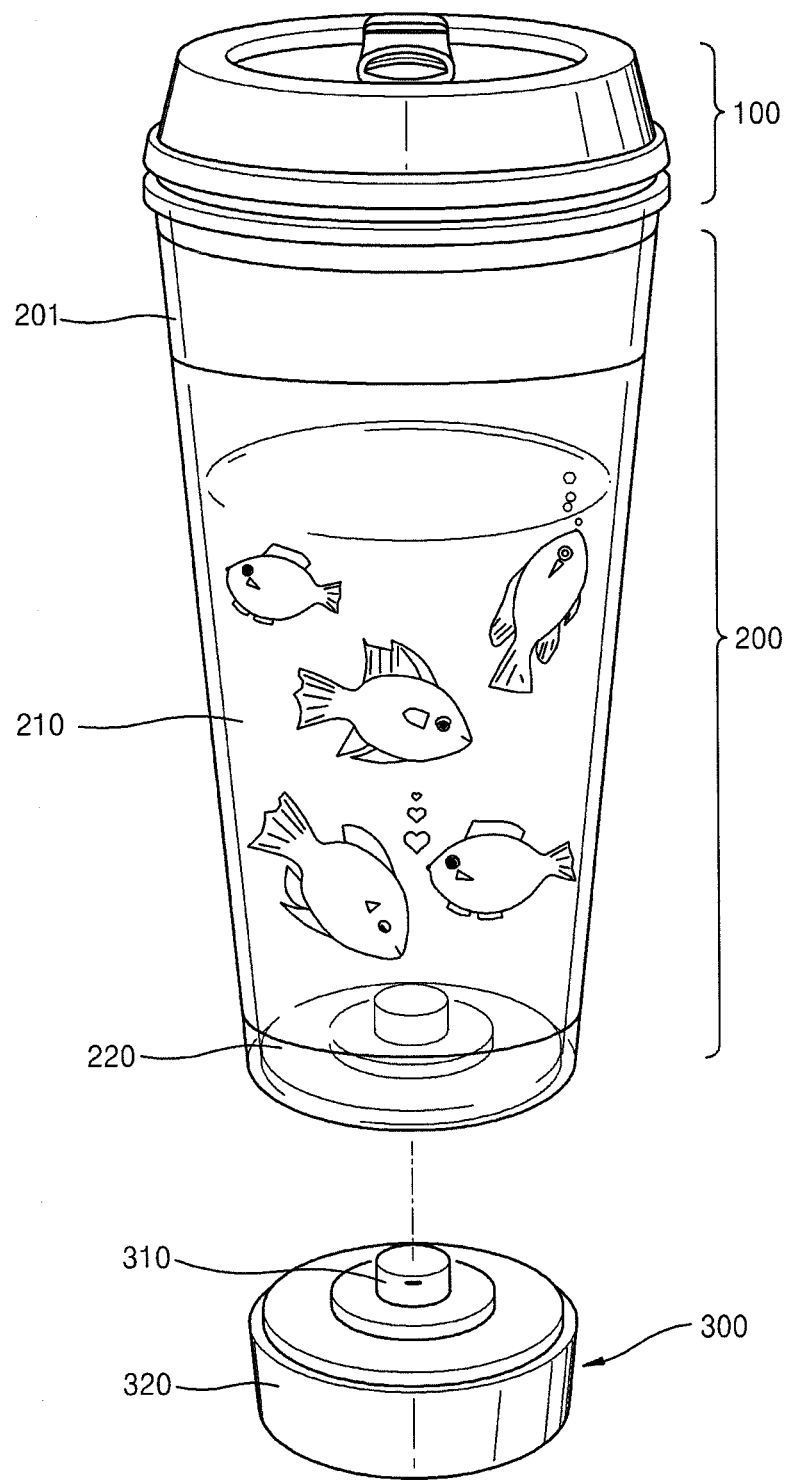
FIG. 2 illustrates configuration in which a support is attached to or detached from a body, according to an example embodiment.

FIG. 2 illustrates configuration in which the support 300 is attached to or detached from the body 200, according to an embodiment.

Referring to FIG. 2, the body 200 and the support 300 are separated. The support 300 may include the coupling unit 310 and a supporting unit 320. The coupling unit 310 may be combined with the bottom board 220 and then may provide the control signal and the electric power. The coupling unit 310 may be electrically or physically combined with the bottom board 220. The supporting unit 320 may include the processor (not shown), e.g., a microprocessor, to generate an image for the display unit 210 which is to be displayed on the cup. Also, the supporting unit 320 may be wired or wirelessly connected with an external power supply unit (not shown), and may receive a power to be supplied to the display unit 210 of the body 200.

In addition, a communication device (not shown) enabled to communicate with the external device 500 may be included in the supporting unit 320, so that the communication device provides an environment in which the support 300 may communicate with the external device 500. In the present example embodiment, the support 300 may receive data after communication, e.g., via a communication network 400, with the external device 500 (e.g., a user terminal such as a smart phone, a personal computer (PC), or the like), may generate an image based on the data, and may transfer a control signal of the display unit 210, based on the image, to the display unit 210 via the coupling unit 310 and then the bottom board 220.

Figure 3:
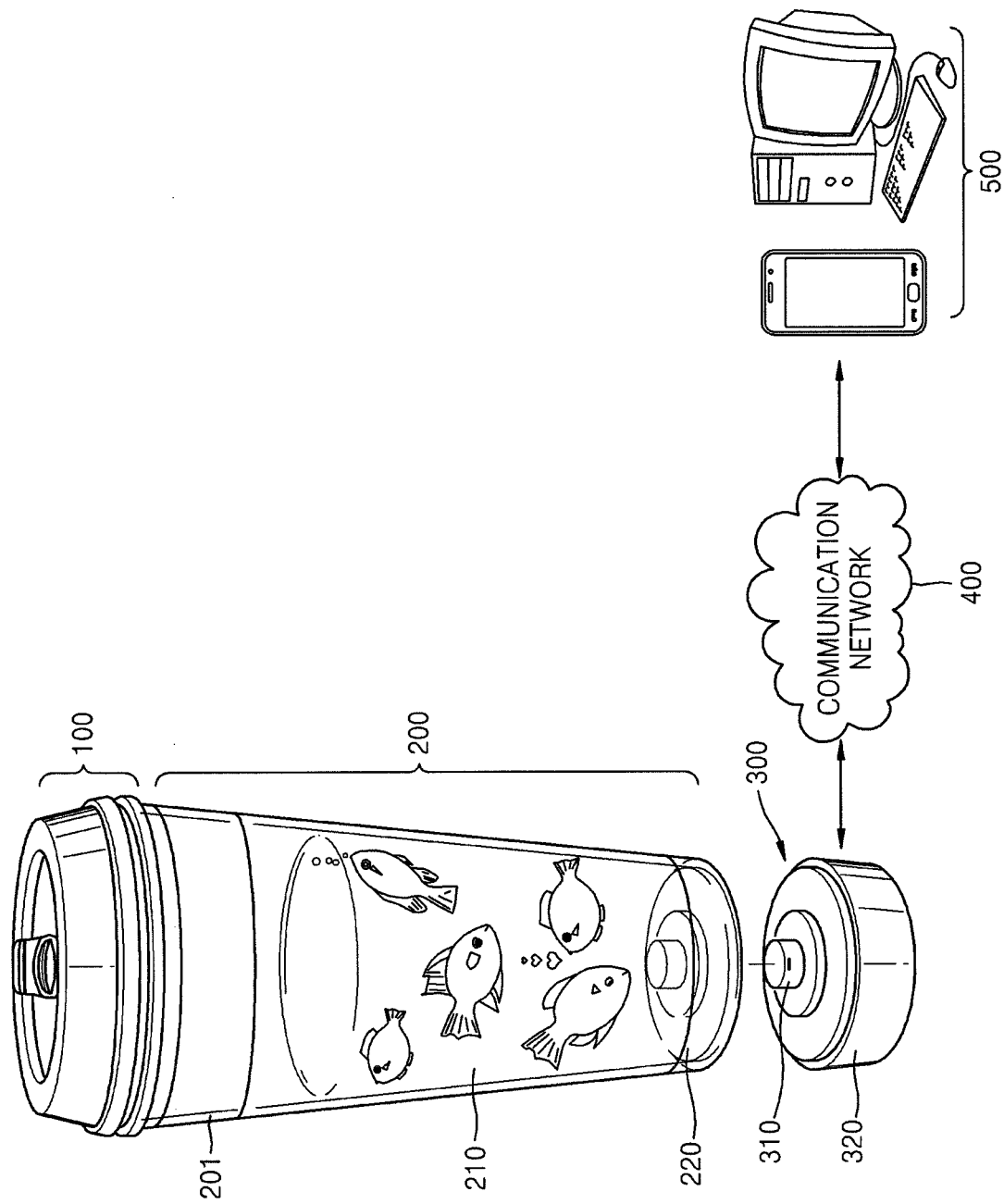
FIG. 3 illustrates configuration in which the support communicates with an external device, according to an example embodiment.

FIG. 3 illustrates configuration in which the support 300 communicates with the external device 500, according to an example embodiment.

As described above, the support 300 may include a communication device. Thus, the support 300 may communicate with the external device 500 via the communication network 400. The external device 500 may correspond to, e.g., a user terminal device including a mobile device, a PC, or the like of a user.

Also, the communication network 400 may collectively include wired and wireless communication networks. Examples of the communication network 400 that is the wireless communication network may include a wireless local area network (WLAN), Wi-Fi, wireless broadband (Wibro), world interoperability for microwave access (Wimax), high speed downlink packet access (HSDPA), long term evolution (LTE), IEEE 802.16, wireless mobile broadband service (WMBS), or the like. Also, examples of the communication network 400 that is a near field wireless communication network may include Bluetooth, radio frequency identification (RFID), infrared data association (IrDA), ultra wideband (UWB), ZigBee, or the like. Also, examples of the communication network 400 that is the wired communication network may include power line communication (PLC), broadband network, or the like, and when the communication network 400 in the form of the wired communication network is used, a cable may be used so as to connect the external device 500 and the support 300.

Figure 4:
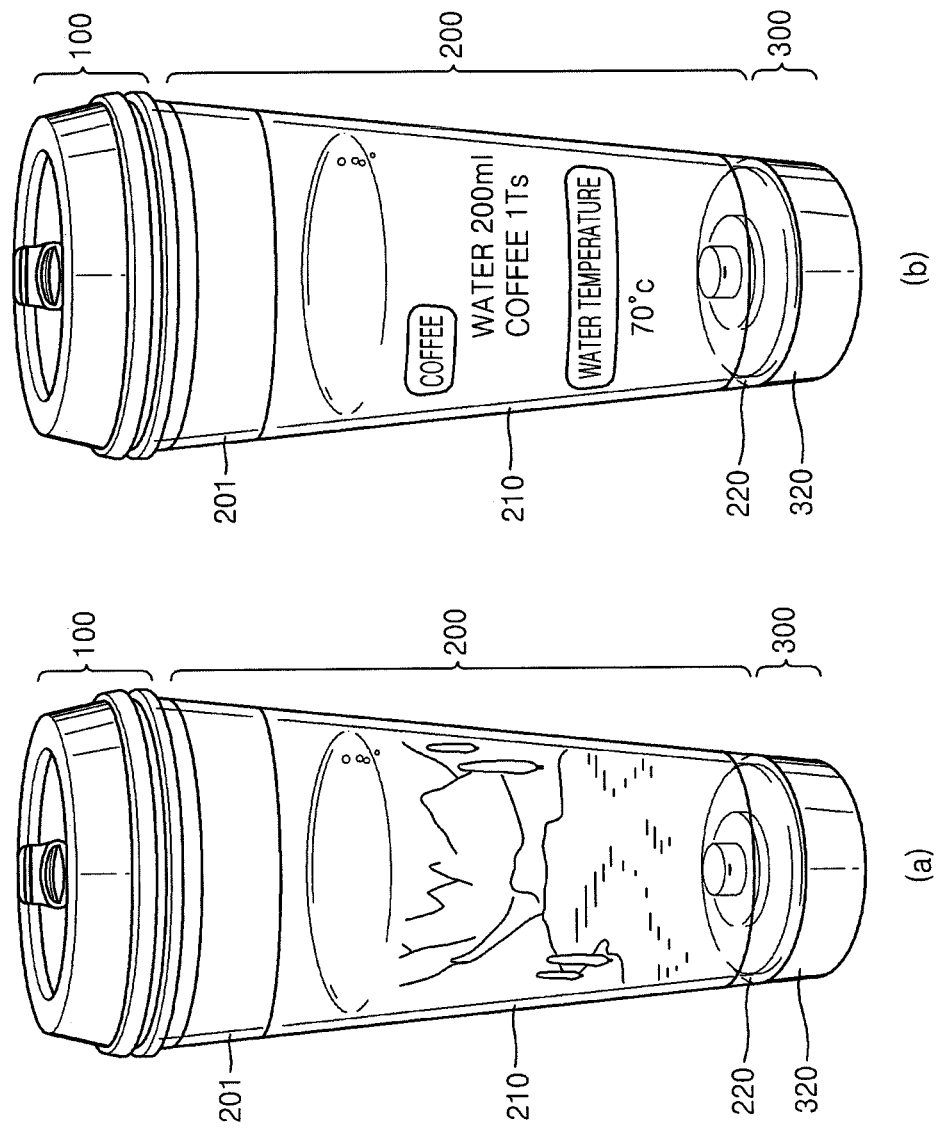
FIG. 4 illustrates examples in which a display of the cup is changed, according to an example embodiment.

FIG. 4 illustrates examples in which a display of the cup is changed, according to an example embodiment.

According to the present example embodiment, a user may use the external device 500 to change an image that is displayed on the display unit 210, as illustrated in FIGS. 4(*a*) and 4(*b*). For example, the external device 500 may communicate with the support 300 via the communication network 400, and the support 300 may generate an image based on data received from the external device 500, may convert the image into a control signal, and then may transmit the control signal to the display unit 210 of the body 200.

FIG. 4(*a*) corresponds to the example in which the display unit 210 displays an art work according to user setting.

FIG. 4(*b*) corresponds to the example in which the display unit 210 displays a temperature of current contents, and a recipe (a method of making) for target contents. As described above, the bottom board 220 may have a thermometer function. Thus, the processor in the supporting unit 320 may obtain temperature information, and may allow the display unit 210 to display the temperature information of the current contents and to display the recipe for the target contents according to a value that is input by the user via the external device 500. By so doing, user convenience may be improved.

In another implementation, in addition to the examples of FIGS. 4(*a*) and 4(*b*), the display unit 210 may solely function as lighting according to user setting. In this regard, the user may set the display unit 210 to function as the lighting by increasing brightness of the display unit 210 in a dark place.

Figure 5:
FIG. 5 illustrates an example in which a user manipulates a display unit by changing a coupling status of a bottom board and the body 200, according to an example embodiment.

FIG. 5 illustrates an example in which a user manipulates the display unit 210 by changing a coupling status of the bottom board 220 and the body 200, according to an example embodiment.

After the user couples the body 200 of the cup with the support 300, the user may change an image displayed on the display unit 210 by, e.g., changing a coupling angle. Thus, the user may control the display unit 210 to display a different image by turning the support 300 in a clockwise direction or a counterclockwise direction with respect to the body 200 so as to change the coupling angle relative thereto. By so doing, the user may, e.g., change an image displayed on the display unit 210 via simple manipulation, without using the external device 500.

In the present example embodiment, the display unit 210 may be an organic light-emitting display device. Hereinafter, a detailed structure of the display unit 210 is described in which the display unit 210 is an organic light-emitting display device having transparency and flexibility.

Figure 6:
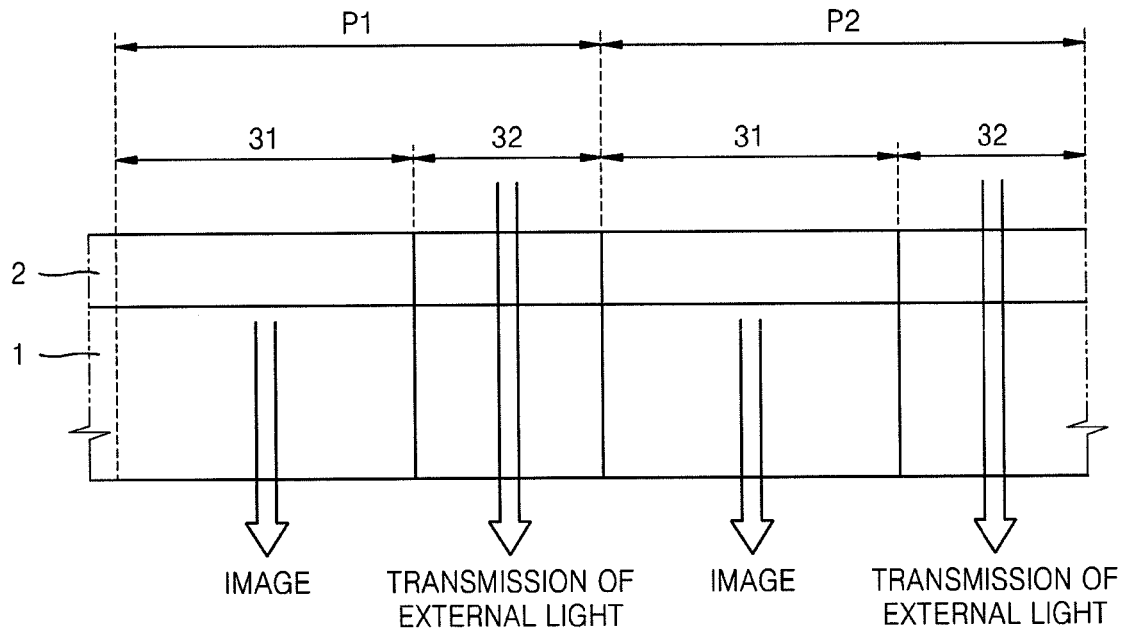
FIG. 6 is a cross-sectional view illustrating the display unit, according to an example embodiment.

FIG. 6 is a cross-sectional view illustrating the display unit 210, according to an example embodiment.

Referring to FIG. 6, the display unit 210 has a structure in which a display portion 2 is arranged on a flexible substrate 1.

The flexible substrate 1 may be formed of a plastic material including polyethylene ether phthalate, polyethylene naphthalate (PEN), polycarbonate, polyetherimide, polyether sulfone, polyimide, or the like, which has excellent heat-resistance and durability. In an implementation, various flexible materials may be used.

At the display unit 210 that is the organic light-emitting display device, external light is incident after passing through the flexible substrate 1 and the display portion 2.

As will be described below, the display portion 2 may transmit the external light. In this regard, referring to FIG. 6, a user at a side where an image is displayed may observe an image at the outside a top surface of the flexible substrate 1 via the display portion 2. In the embodiment of FIG. 6, the display unit 210 is formed as a bottom emission type organic light-emitting display device in which an image of the display portion 2 is realized toward the flexible substrate 1. However, embodiments may be equally applied to a top-emission type organic light-emitting display device in which an image is realized away from the flexible substrate 1.

FIG. 6 illustrates a first pixel P1 and a second pixel P2 that are two adjacent pixels of the display unit 210, and each of the first and second pixels P1 and P2 includes a first region 31 and a second region 32. An image is realized on the display portion 2 via the first region 31, and external light passes through the second region 32. Thus, in the present example embodiment, each of the first and second pixels P1 and P2 includes the first region 31 for realization of an image and the second region 32 for transmission of external light. Thus, the user may view an external image via the second region 32.

Here, by not forming devices such as a TFT, a capacitor, an organic light emitting diode (OLED), or the like in the second region 32, it may be possible to maximize external-light transmittance and to minimize distortion of a transmitted image, wherein the distortion occurs due to interference by the TFT, the capacitor, the OLED, or the like.

In addition, although not illustrated in FIG. 6, a flexible encapsulation substrate, as an encapsulation member, may be arranged on the display portion 2. Also, various protective members as well as the flexible substrate 1 and the flexible encapsulation substrate may be further formed.

Figure 7:
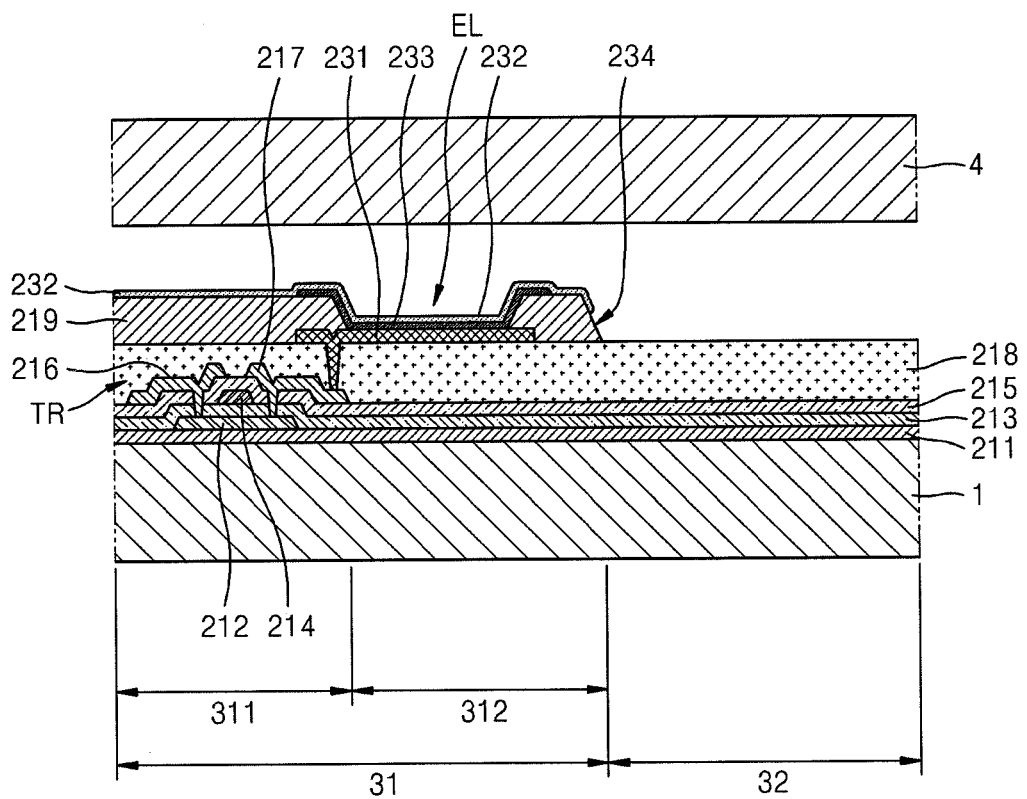
FIG. 7 is a cross-sectional view illustrating the display unit that is an organic light-emitting display device of FIG. 6.

FIG. 7 is a cross-sectional view illustrating the display unit 210 that is the organic light-emitting display device of FIG. 6.

In the example embodiment illustrated in FIG. 7, a TFT TR is formed at a circuit region 311 (a total number of the TFT TR is not limited to what is shown in FIG. 7) and a pixel circuit including the TFT TR may be formed. The pixel circuit may further include a plurality of TFTs as well as the TFT TR, and a plurality of storage capacitors, and may include lines such as scan lines, data lines, VDD lines, or the like, which are connected to the TFTs, the TFT TR, and the storage capacitors. An OLED EL that is an emission device is disposed at an emission region 312. The OLED EL is electrically connected to the TFT TR of the pixel circuit. A buffer layer 211 is formed on the flexible substrate 1, and the pixel circuit including the TFT TR is formed on the buffer layer 211.

For example, first, a semiconductor active layer 212 is formed on the buffer layer 211.

The buffer layer 211 is formed of a transparent insulating material, and functions to prevent penetration of foreign substances and to planarize a surface of the flexible substrate 1. The buffer layer 211 may be formed of various materials capable of performing the aforementioned functions. For example, the buffer layer 211 may be formed of an inorganic material such as silicon oxide, silicon nitride, silicon oxynitride, aluminum oxide, aluminum nitride, titanium oxide, or titanium nitride, or an organic material such as polyimide, polyester, acryl, or the like, or may be formed as a multi-stack including the inorganic material and the organic material. In an implementation, the buffer layer 211 may be omitted.

The semiconductor active layer 212 may be formed of, e.g., polycrystalline silicon, and may be formed as an oxide semiconductor. For example, the semiconductor active layer 212 may be a G-I-Z-O layer [$(In_2O_3)_a(Ga_2O_3)_b(ZnO)_c$ layer (where, a, b, c are actual numbers that satisfy a≥0, b≥0, c>0, respectively)]. When the semiconductor active layer 212 is formed as the oxide semiconductor, light-transmittance at the circuit region 311 of the first region 31 may be further increased, so that light-transmittance for external light at an entire portion of the display portion 2 may be increased.

A gate insulating layer 213 is formed on the buffer layer 211 so as to cover the semiconductor active layer 212, and a gate electrode 214 is formed on the gate insulating layer 213.

Then, an interlayer insulating layer 215 is formed on the gate insulating layer 213 so as to cover the gate electrode 214, and a source electrode 216 and a drain electrode 217 are formed on the interlayer insulating layer 215 so that the source electrode 216 and the drain electrode 217 contact the semiconductor active layer 212 via contact holes, respectively.

In an implementation, the TFT TR may have one of various structures.

A passivation layer 218 is formed to cover the TFT TR. The passivation layer 218 may be formed as single or multiple insulating layers of which top surface is planarized. The passivation layer 218 may be formed of an inorganic material and/or an organic material.

As illustrated in FIG. 4, a first electrode 231 of the OLED EL that is electrically connected with the TFT TR is formed on the passivation layer 218. The first electrode 231 has an island form that is separate in each pixel.

Then, an insulating layer 219 formed of an organic insulating material and/or an inorganic insulating material is formed on the passivation layer 218.

The insulating layer 219 covers side portions of the first electrode 231 and exposes a central portion of the first electrode 231. The insulating layer 219 may cover the first region 31, in more detail, the insulating layer 219 may not cover an entire portion of the first region 31 and may cover a portion of the first region 31, particularly, the side portions of the first electrode 231.

An organic layer 233 and a second electrode 232 are sequentially stacked on the first electrode 231. The second electrode 232 covers the organic layer 233 and the insulating layer 219, and is electrically connected with all pixels.

The organic layer 233 may be formed as a small-molecule organic layer or a polymer organic layer. When the organic layer 233 is formed as the small-molecule organic layer, the organic layer 233 may have a structure in which a hole injection layer (HIL), a hole transport layer (HTL), an emission layer (EML), an electron transport layer (ETL), an electron injection layer (EIL) or the like are singularly or multiply stacked, and may be formed by using one of various organic materials including copper phthalocyanine (CuPc), N,N'-Di (naphthalene-1-yl)-N,N'-diphenyl-benzidine (NPB), tris-8-hydroxyquinoline aluminum)(Alq3), or the like. The small-molecule organic layer may be formed by using a vacuum deposition method. Here, the HIL, the HTL, the ETL, and the EIL are common layers, and thus may be commonly applied to red, green, and blue pixels.

The first electrode 231 may function as an anode electrode, and the second electrode 232 may function as a cathode electrode. In another implementation, polarity of the first electrode 231 and the second electrode 232 may be switched.

In the present example embodiment, the first electrode 231 may be a transparent electrode, and the second electrode 232 may be a reflective electrode. The first electrode 231 may be formed of ITO, IZO, ZnO, or $In_2O_3$ which has a high work function. The second electrode 232 may be formed of metal such as Ag, Mg, Al, Pt, Pd, Au, Ni, Nd, Ir, Cr, Li, or Ca which has a low work function. Thus, the organic light-emitting display device of FIG. 7 may be a bottom emission-type organic light-emitting display device in which an image is realized toward the first electrode 231. In another implementation, the second electrode 232 may also be formed as a transparent electrode.

The passivation layer 218, the gate insulating layer 213, the interlayer insulating layer 215, and the insulating layer 219 may be formed as transparent insulating layers.

A flexible encapsulation substrate 4 may be formed on the second electrode 232. The flexible encapsulation substrate 4 may be externally bonded with the flexible substrate 1 by using a separate sealant (not shown), so that the flexible encapsulation substrate 4 may encapsulate the display portion 2 against outside air. A separate filling material (not shown) may fill a space between the flexible encapsulation substrate 4 and the second electrode 232, and an absorbent may be interposed there between. The flexible encapsulation substrate 4 may be formed of the same material as the flexible substrate 1, may have a multi-inorganic layer structure or a structure including an inorganic layer and an organic layer, etc. In another implementation, the encapsulation structure for the display portion 2 may use a film-type encapsulation structure.

In the present example embodiment, a transmission window 234 may be further formed at the second electrode 232 and the insulating layer 219. The transmission window 234 may be formed only at the second electrode 232, and may be further formed at one of the passivation layer 218, the interlayer insulating layer 215, the gate insulating layer 213, and the buffer layer 211.

By way of summation and review, a display device may be formed of a high definition flat panel-type display module such as an organic light-emitting display panel, a liquid crystal display (LCD) panel, a plasma display panel, or the like. Also, according to types of the display device, a transparent display device and a flexible display device are being developed.

A tumbler may be a flat-bottom cup that is used by a person to, e.g., drink a beverage. In general, the tumbler has a circular or cylindrical shape as a cup. The tumbler may be formed of a heat-resistant material, and may perform heat retention and cold retention functions so as to maintain a temperature of contents. The use of the tumbler instead of a disposable cup may help protect the environment.

As described above, embodiments relate to a cup that has a transparent flexible display applied to its body and that may display preset or a user-set image on the transparent flexible display. Embodiments may provide a cup, such as tumbler, having a body that includes a transparent display for displaying user-set content. The transparent display may be charged by using a support that is connected with the cup. According to the one or more embodiments, the cup may include a display that displays a user-desired image or preset image on the body of the cup, may charge the display via the support that is connected with the body, and may communicate with an external device via the support.

For the sake of brevity, conventional electronics, control systems, software development and other functional aspects of the systems (and components of the individual operating components of the systems) may not be described in detail herein. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the embodiments unless the element is specifically described as "essential" or "critical."

The use of the terms "a" and "an" and "the" and similar referents in the context of describing the embodiments (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. The steps of all methods described herein may be performed in any suitable order unless otherwise indicated herein or otherwise clearly contradicted by context.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A cup having a transparent display, the cup comprising:
   a body, the body having a cavity and including a display unit, the display unit being configured to display an image, and being configured to transmit light so as to show contents contained in the cavity; and
   a support being attached to or detached from the body, generating a control signal so as to control the image displayed on the display unit, and transmitting the control signal to the body, wherein the display unit displays a different image in response to changing a coupling angle with the body and the support.

2. The cup as claimed in claim 1, wherein the body includes a bottom board that is electrically or physically connected with the support.

3. The cup as claimed in claim 2, wherein the bottom board measures a temperature of the contents and then transmits a value of the temperature to the support.

4. The cup as claimed in claim 2, wherein the bottom board adjusts a temperature of the contents by transmitting heat from the support.

5. The cup as claimed in claim 2, wherein the display unit is connected with the bottom board via lines, and the image is controlled by the control signal that is transferred from the support to the bottom board.

6. The cup as claimed in claim 1, wherein the display unit is formed at an outer wall of the body.

7. The cup as claimed in claim 1, wherein the support receives data about an image to be displayed on the display unit, by communicating with an external device, and generates the control signal based on the image.

8. The cup as claimed in claim 1, wherein the support supplies a charge power to the display unit of the body.

9. The cup as claimed in claim 1, wherein the image corresponds to a temperature of the contents.

10. The cup as claimed in claim 1, wherein the image corresponds to a method of making the contents.

11. The cup as claimed in claim 1, wherein the display unit includes a plurality of transparent organic light emitting diodes (OLEDs), each having a hole injection layer, an emission layer, and an electron injection layer.

12. The cup as claimed in claim 1, wherein the display unit includes a transparent electrode and a transparent substrate.

13. The cup as claimed in claim 1, wherein the display unit functions as lighting, and the support generates a control signal so as to control brightness of the display unit.

14. A method of controlling the cup as claimed in claim 1 having a transparent display, the method comprising:
   generating, by the support of the cup, the control signal so as to control the image that is displayed on the display unit of the body;
   providing, by the support, an electric power to the display unit of the body; and
   displaying the image according to the control signal, by the display unit of the body which receives the electric power,
   wherein, when the display unit does not receive the electric power, the display unit shows contents in the body.

15. The method as claimed in claim 14, wherein the support receives data about the image to be displayed on the display unit, by communicating with an external device, and generates the control signal based on the image.

16. The method as claimed in claim 14, wherein the image corresponds to a temperature of the contents in the body or corresponds to a method of making the contents.

17. A cup having a transparent display, the cup comprising:
a body, the body having a cavity and including a display unit at a wall of the cavity, wherein:
the display unit is configured to display an image, and is configured to transmit light so as to show contents contained in the cavity, and
the body is configured to attach to and detach from a support, and is configured to receive a control signal generated by the support, the control signal controlling the image displayed on the display unit, and the control signal controlling a different image displayed on the display unit in response to changing a coupling angle with the body and the support.

* * * * *